(12) United States Patent
Ueda et al.

(10) Patent No.: US 6,908,638 B2
(45) Date of Patent: *Jun. 21, 2005

(54) ORGANIC ELECTROLUMINESCENT ELEMENT AND METHOD OF MANUFACTURING SAME

(75) Inventors: Hideaki Ueda, Kishiwada (JP); Keiichi Furukawa, Suita (JP); Yoshihisa Terasaka, Suita (JP)

(73) Assignee: Minolta Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 349 days.

(21) Appl. No.: 09/067,746

(22) Filed: Apr. 28, 1998

(65) Prior Publication Data

US 2001/0003601 A1 Jun. 14, 2001

(30) Foreign Application Priority Data

May 1, 1997 (JP) .............................................. 9-113849

(51) Int. Cl.⁷ .............................. B05D 5/12; B05D 3/10; B05D 3/06; B05D 3/04
(52) U.S. Cl. ........................... 427/66; 427/68; 427/534; 427/535
(58) Field of Search ........................... 427/66, 68, 534, 427/535; 478/690; 313/504

(56) References Cited

U.S. PATENT DOCUMENTS

| 3,530,325 A | | 9/1970 | Mehl et al. .................. 313/108 |
| 4,344,010 A | * | 8/1982 | Vig et al. .................... 310/315 |
| 4,539,507 A | | 9/1985 | VanSlyke et al. ........... 313/504 |
| 4,548,699 A | * | 10/1985 | Hutchinson et al. ........ 118/729 |
| 4,720,432 A | | 1/1988 | VanSlyke et al. ........... 428/457 |
| 4,842,680 A | * | 6/1989 | Davis et al. ............ 156/345.29 |
| 4,937,653 A | * | 6/1990 | Blonder et al. .............. 257/739 |
| 5,130,603 A | * | 7/1992 | Tokailin et al. ........ 252/301.16 |
| 5,188,901 A | * | 2/1993 | Shimizu et al. ............. 428/421 |
| 5,286,337 A | * | 2/1994 | Tsou ........................... 216/23 |
| 5,480,492 A | * | 1/1996 | Udagawa et al. ............. 134/1.3 |
| 5,622,564 A | * | 4/1997 | Vignola et al. .............. 118/715 |

(Continued)

FOREIGN PATENT DOCUMENTS

| JP | 59-194393 | 11/1984 |
| JP | 63-295695 | 12/1988 |
| JP | 07-142168 A | 6/1995 |
| JP | 7-220873 | 8/1995 |

OTHER PUBLICATIONS

"The electrical and luminescent properties in organic LED: the effects of preparation conduction," Tatsuro Mori, Tomoaki Kichimi, and Teruyoshi Mizutani, Elect. Engineering, School of Engineering, Nagoya University, Japan, pp:5–347–8, 1993.

Primary Examiner—Michael Cleveland
(74) Attorney, Agent, or Firm—Morrison & Foerster LLP

(57) ABSTRACT

The purpose of the invention is to provide an organic electroluminescent element having stable luminescent characteristics with a low luminescence starting voltage and without non-luminescing black spots in the luminescing surface. The invention relates to a method of manufacturing an organic electroluminescent element and an organic electroluminescent element produced by said method, said method of manufacturing an organic electroluminescent element comprising a process for forming a positive electrode substrate by dry etching a transparent electrode in a vacuum, a process for dry washing said positive electrode substrate in a continuous vacuum without exposure to air, a process for forming an organic layer incorporating an organic luminescing layer on said positive electrode substrate, and a process for forming a negative electrode on said organic layer.

20 Claims, 6 Drawing Sheets

U.S. PATENT DOCUMENTS

| | | | | |
|---|---|---|---|---|
| 5,652,067 A | * | 7/1997 | Ito et al. | 428/690 |
| 5,701,168 A | * | 12/1997 | Patel | 349/130 |
| 5,703,436 A | * | 12/1997 | Forrest et al. | 313/503 |
| 5,709,959 A | * | 1/1998 | Adachi et al. | 428/690 |
| 5,747,135 A | * | 5/1998 | Chakrabarti et al. | 428/64.1 |
| 5,834,053 A | * | 11/1998 | Dye et al. | 427/162 |
| 5,902,688 A | * | 5/1999 | Antoniadis et al. | 313/505 |
| 6,001,413 A | * | 12/1999 | Matsuura et al. | 427/64 |
| 6,132,280 A | * | 10/2000 | Tanabe et al. | 445/24 |

* cited by examiner

ORGANIC ELECTROLUMINESCENT ELEMENT AND METHOD OF MANUFACTURING SAME

This application is based on Application No. HEI 9-113849 filed in Japan, the content of which is hereby incorporated by reference.

BACKGROUND OF THE INVENTION

1. Field of the Invention

The present invention relates to an organic electroluminescent element and method of manufacturing same.

2. Description of the Related Art

Organic electroluminescent elements are elements constructed using organic compounds as light-emitting materials which emit light in accordance with electrical signals.

Organic electroluminescent elements basically comprise an organic light-emitting layer interposed between a pair of opposing electrodes. Light emission is a phenomenon occurring when electrons are injected by one electrode and holes are injected by another electrode, so as to excite the light-emitting member within the light-emitting layer to a higher energy level, such that when the excited light-emitting member returns to its original lower energy state, the surplus energy is released as light.

A hole injection layer for the electrode which injects holes, and an electron transporting layer is provided for the electrode which injects electrons in addition to the aforesaid basic construction so as to increase the luminous efficiency.

An example of organic electroluminescent elements using a single crystal anthracene as a light emitter is disclosed in U.S. Pat. No. 3,530,325.

Japanese Laid-Open Patent Application No. SHO 59-194393 discloses an organic electroluminescent element comprising a combination of an organic light-emitting layer and a hole injecting layer.

Japanese Laid-Open Patent Application No. SHO 63-295695 discloses an organic electroluminescent element comprising a combination of an organic material electron injecting/transporting layer and an organic material hole injecting/transporting layer.

These multi-layer construction organic electroluminescent elements are formed of multiple layers of organic luminescent material, charge-transporting organic material (charge-transporting member), and electrodes, and accomplish light emission by the injection of holes and electrons by the respective electrodes which move within the charge-transporting member, and recombine. Examples of useful organic luminescent material includes organic colorants which luminesce such as 8-quinolinol-aluminum complex, coumarin compound and the like. Examples of useful charge-transporting materials include N,N'-di(m-tolyl)N,N'-diphenylbenzidene, 1,1-bis[N,N-di(p-tolyl)aminophenyl] cyclohexane and like diamino compounds, 4-(N,N-diphenyl)aminobenzaldehyde-N,N-diphenylhydrozone compound and the like. Porphyrin compounds such as copper phthalocyanine have also been proposed.

Although organic electroluminescent elements have high luminescence characteristics, they have inadequate storage stability and stability when luminescing and are as yet unsuitable for practical use.

Japanese Laid-Open Patent Application No. HEI 7-142168 discloses an example of an improvement of the aforesaid organic electroluminescent elements by subjecting the positive electrode to plasma surface processing, and subsequently forming an organic layer on said positive electrode without exposing the electrode to air.

Japanese Laid-Open Patent Application No. HEI 7-220873 discloses a dry etching process as a method of plasma surface processing of a positive electrode, but did not disclose all details of this dry etching process.

OBJECTS AND SUMMARY

In view of the aforesaid information, an object of the present invention is to provide an organic electroluminescent element having stable luminescence characteristics and low luminescence starting potential without black dot-like not luminescing areas in the luminescent surface, and method of manufacturing same.

The present invention relates to method of manufacturing an organic electroluminescent element comprising:

a process for forming a positive electrode substrate by dry etching of a transparent electrode in a vacuum;

a process for dry washing of said positive electrode substrate while continuously in a vacuum without exposure to air;

a process for forming an organic layer including an organic luminescent layer on an electrode substrate; and a process for forming a negative electrode on said organic layer; and an organic electroluminescent element manufactured by said method.

BRIEF DESCRIPTION OF THE DRAWINGS

These and other objects and features of the present invention will become apparent from the following description of the preferred embodiments thereof taken in conjunction with the accompanying drawings, in which.

In the following description, like parts are designated by like reference numbers throughout the several drawings.

DETAILED DESCRIPTION OF THE PREFERRED EMBODIMENTS

Figure 1:
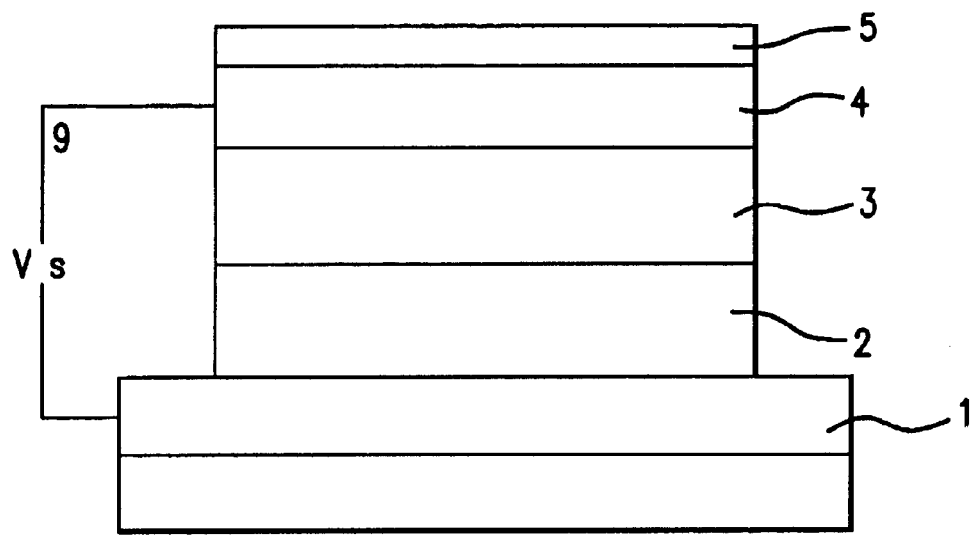
FIG. 1 is a brief section view showing an example of the construction of an organic electroluminescent element of the present invention.

The organic electroluminescent element of the present invention is constructed by at least an organic luminescent layer and, as desired, an organic hole-transporting layer interposed between electrode substrates.

In the present invention, forming of the organic electroluminescent element is basically accomplished using a transparent electrode substrate formed by subjecting a transparent electrode to patterning by dry etching, and dry washing said patterned electrode substrate in a continuous vacuum without exposure to air.

The dry etching method in the present invention utilizes a plasma etching device using parallel, flat panel electrodes.

The etching gas used in this process may be $CH_4$, HCl, HBr, HI, $C_2H_5I$ and the like, but HI and $C_2H_5I$ are desirable from the perspectives of their high etching rate and taper angle (i.e., the etched cross section taper is virtually nil).

These gases may be diluted or augmented by mixing with hydrogen, argon, nitrogen, methanol, water vapor and the like.

Adjustment of the process to remove decomposition elements of the positive electrode is accomplished via the flow rate of the etching gas.

The flow rate of the etching gas will depend on the size of the substrate, but is desirably a flow in the range of about 200~600 sccm.

The high frequency RF power will depend on the size of the substrate, but may be in the range of about 600~3,000 W. After forming the electrode pattern via dry etching, the vacuum is weakened, and output reduced to re-etch under less stringent conditions; this process is desirable to stabilize the surface condition of the substrate.

The electrode substrate patterned by etching is then dry washed under continuous vacuum without exposure to air.

Various methods such as a plasma process using oxygen, ultraviolet(UV)/ozone cleaning method, excimer lamp irradiation and like methods may be used as the dry washing method utilized in the present invention.

Plasma processes using oxygen are performed using a commercial parallel panel type plasma device in air at atmospheric pressure or in a vacuum with an oxygen density (gas pressure) of 0.01 Torr or higher.

UV/ozone cleaning is performed using a commercial UV/ozone device in air at atmospheric pressure or in a vacuum with an oxygen density (gas pressure) of 0.01 Torr or higher.

Processing time typically lasts 10~60 min, and the processing time is adjusted by monitoring the contact angle and moisture of the surface of the ITO membrane.

Excimer lamp irradiation is performed in air at atmospheric pressure or in a vacuum with an oxygen density (gas pressure) of 0.01 Torr or higher using a commercial excimer lamp irradiating at a distance of 0.1~10 mm.

Irradiation time typically lasts 1~10 min, and is adjusted by monitoring the contact angle and moisture of the surface of the ITO membrane.

Although the excimer lamp used in the present invention may be of any type insofar as the lamp emits light having a wavelength of 310 nm or less, it is particularly desirable that that the lamp generates short-wavelength ultraviolet rays of a single wavelength.

Furthermore, cleaning effectiveness is increased and light emission characteristics are improved when the generated ultraviolet rays has a short wavelength near 170 nm.

Specifically, a dielectric barrier excimer lamp may be used, for example, as the excimer lamp in the present invention, although the present invention is not limited to the use of a lamp of this type.

In the present invention, there is no contamination by impurities, and a clean tapered edge can be formed on the electrode during manufacture by patterning via the aforesaid dry etching process in a vacuum. Performing the dry cleaning process under a continuous vacuum makes for an extremely clean surface on the positive electrode by eliminating the exposure which cuts the chemical bonds of the organic matter adhered to the positive electrode. A uniform thin organic layer can be formed by bonding the electrode substrate and the thin organic membrane on said positive electrode.

Since the surface of the positive electrode is oxidized by the excited oxygen atoms, there is a larger ionization potential and excellent hole injection.

The light emission emitted from the luminous layer is uniform and emission starts at a low potential due to the ease of hole injection so as to obtain a high degree of luminance. Therefore, a long service life of continuous emission at the same luminance is obtained.

In the conventional art, impurities such as organic and inorganic matter produced by wet-type etching adhere to the surface of the electrode and increase the emission starting voltage or prevent uniform emission from the surface of the organic electroluminescent element, producing the disadvantage of rapid deterioration of the element.

Furthermore, electrical conductivity is reduced when the positive electrode is somewhat oxidized, thereby causing poor light emission and raising the emission starting voltage.

To eliminate the aforesaid disadvantages, the present invention provides for the manufacture of an organic electroluminescent element having stable emission characteristics and low luminescence starting potential without non-emitting black spot areas in the luminescing surface, and having improved hole injection characteristics by suitably oxidizing said positive electrode to eliminate debris and impurities from the surface of the positive electrode in a short time.

FIGS. 1~4 show examples of the organic electroluminescent element of the present invention. In FIG. 1, reference number 1 refers to a positive electrode, over which are sequentially overlaid a hole injecting/transporting layer 2, organic luminescing layer 3, negative electrode 4, and sealing membrane 5 voltage $V_s$ is provided between the positive electrode 1 and the negative electrode 4.

Figure 2:
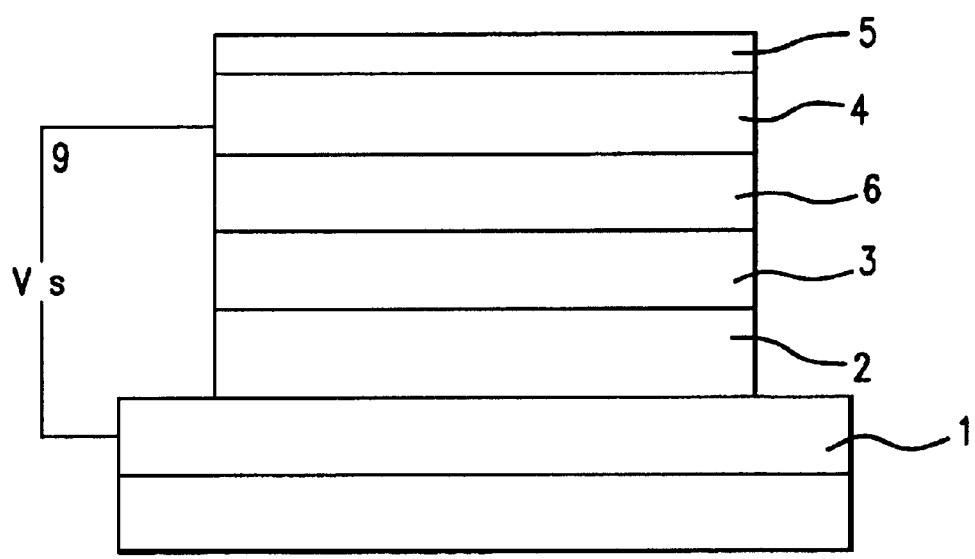
FIG. 2 is a brief section view showing an example of the construction of an organic electroluminescent element of the present invention.

In FIG. 2 reference number 1 refers to a positive electrode, over which are sequentially overlaid a hole injecting/transporting layer 2, organic luminescing layer 3, electron injecting/transporting layer 6, negative electrode 4, and sealing membrane 5.

Figure 3:
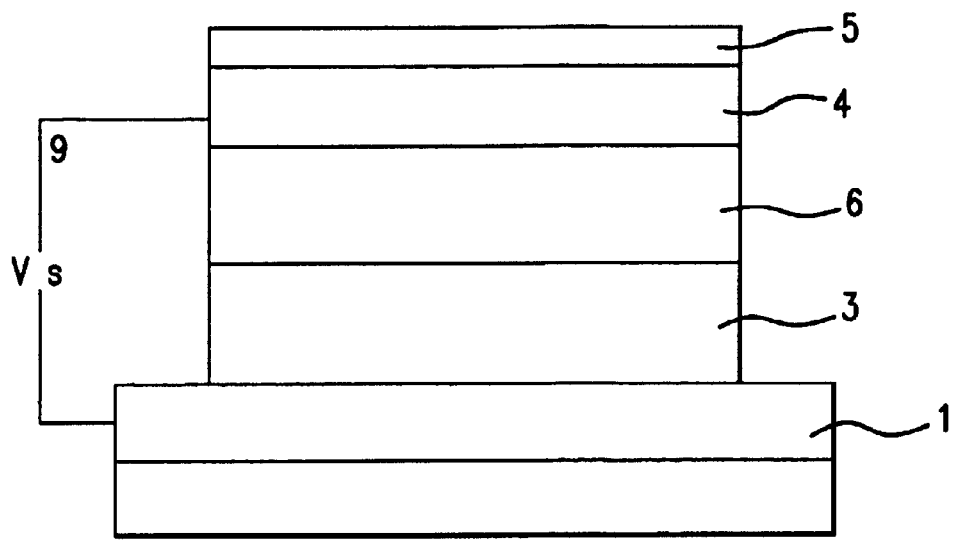
FIG. 3 is a brief section view showing an example of the construction of an organic electroluminescent element of the present invention.

In FIG. 3, reference number 1 refers to a positive electrode, over which are sequentially overlaid an organic luminescing layer 3, electron injecting/transporting layer 6, negative electrode 4, and sealing membrane 5.

Figure 4:
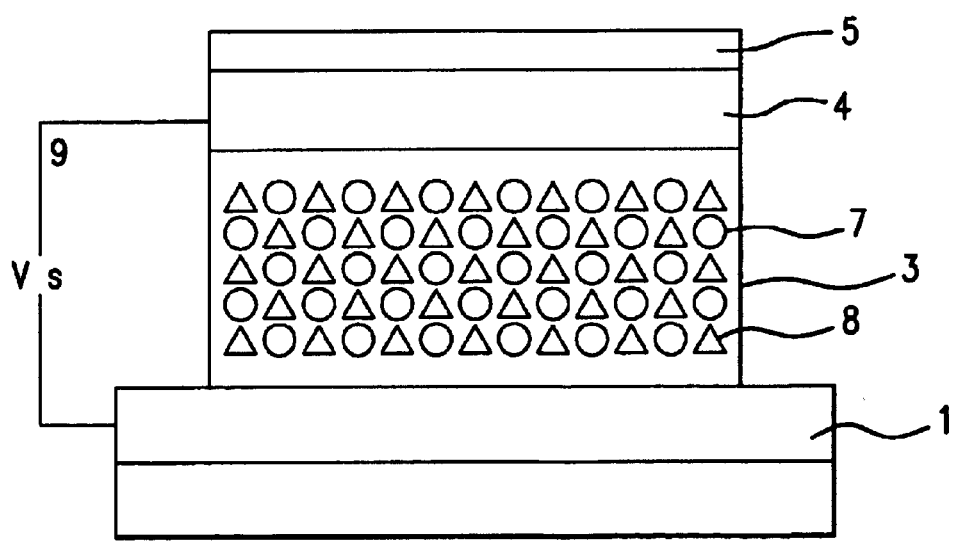
FIG. 4 is a brief section view showing an example of the construction of an organic electroluminescent element of the present invention.

In FIG. 4, reference number 1 refers to a positive electrode, over which are sequentially overlaid an organic luminescing layer 3, negative electrode 4, and sealing membrane 5; the organic luminescing layer 3 may include an organic luminescing material 7 and charge transporting material 8.

The electroluminescent elements of each of the aforesaid constructions produce luminescence in the organic luminescing layer 3 by application of voltages to the positive electrode 1 and negative electrode 4 which are respectively connected by lead wires.

Various other constructions of the present invention in addition to those cited above may include positive electrode and negative electrode provides with organic layers having various functions.

Electrically conductive material having a work function greater than 4 eV may be used as the positive electrode 1 of the organic electroluminescent element, e.g., metals such as carbon, aluminum, vanadium, iron, cobalt, nickel, copper, zinc, tungsten, silver, tin, gold and the like, and conductive metal compounds such as tin oxide, indium oxide, antimony oxide, zinc oxide, zirconium oxide and the like.

In the organic electroluminescent element, at least the positive electrode 1 or negative electrode 4 must be a transparent electrode to see the luminescence. Since transparency rapidly deteriorates when a transparent electrode is used as a negative electrode, it is preferable to use a transparent positive electrode.

When the transparent electrode is formed, the previously mentioned conductive material is deposited on the transparent substrate by vacuum deposition, spattering or like means so as to assure desirable transparency and conductivity.

The transparent substrate is not particularly limited insofar as it is transparent, possesses suitable strength, and is not adversely affected by heat during vacuum deposition or when manufacturing the organic electroluminescent element; examples of useful materials include glass substrate, and transparent resins such as polyethylene, polypropylene, polyether sulfone, polyether ketone and the like. Commercial products such as ITO, NESA and the like may be used to form a transparent electrode on a glass substrate.

In the present invention, the aforesaid transparent electrode is patterned by a dry etching method, and the patterned electrode substrate is subjected to dry washing in continuous vacuum without exposure to air to obtain a transparent electrode substrate. When the transparent electrode is formed in a vacuum, it is desirable that etching a dry washing is accomplished directly while in the vacuum.

Figure 5:
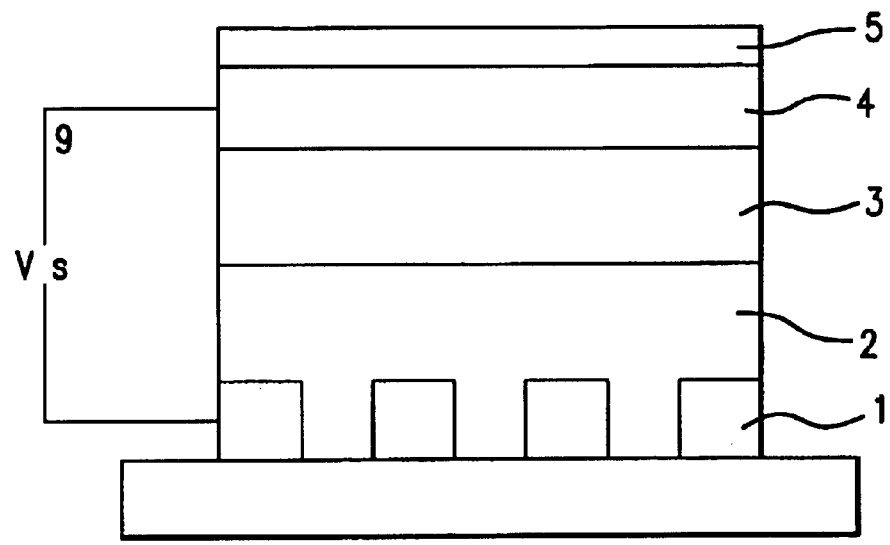
FIG. 5 is a brief section view showing an example of the construction of an organic electroluminescent element of the present invention.
Figure 6:
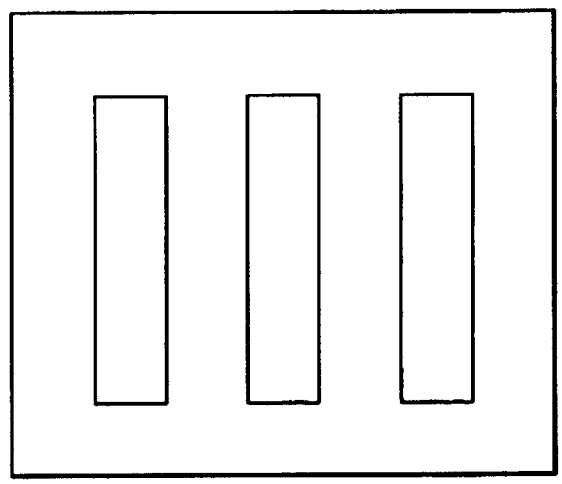
FIG. 6 is a plan view of a metal mask used to pattern the positive electrode 1 in FIG. 1 of the present invention.

After the transparent electrode is formed as a positive electrode, it may be patterned in various configurations. The patterning method may form a patterned electrode 1 such as shown in FIG. 5 by a dry etching method using a window mask such as that shown in FIG. 6. Of course, electrode formation and patterning may be accomplished simultaneously using a mask such as shown in FIG. 6 when forming the transparent electrode.

Specific examples of the manufacture of an electroluminescent element having the construction shown in FIG. 2 are described below using the aforesaid electrode.

First, a hole injecting/transporting layer 2 is formed on the aforesaid positive electrode 1. Well known hole injecting/transporting materials may be used to formed the hole injecting/transporting layer. Examples of useful hole injecting/transporting materials include N,N'-diphenyl-N, N'-bis(3-methylphenyl)-1,1'-diphenyl-4,4'-diamine, N,N' diphenyl-N,N'-bis(4-methylphenyl)-1,1'-diphenyl-4,4'-diamine, N,N'-diphenyl-N,N'-bis(1-naphthyl)-1,1'-diphenyl-4,4'-diamine, N,N'-diphenyl-N,N'-bis(2-naphthyl)-1,1'-diphenyl-4,4'-diamine, N,N'-tetra(4-methylphenyl)-1,1'-diphenyl-4,4'-diamine, N,N'-tetra(4-methylphenyl)-1,1'-diphenyl-4,4'-diamine, N,N'-tetra(4-methylphenyl)-1,1'-bis(3-methylphenyl)-4,4'-diamine, N,N'-diphenyl-N,N'-bis(3-methylphenyl)-1,1'-bis(3-methylphenyl)-4,4'-diamine, N,N'-bis(N-carbazolyl)-1,1'-diphenyl-4,4'-diamine, 4,4'-4"-tris(N-carbazolyl) triphenylamine, N,N,N"-triphenyl-N,N'N"-tris(3-methylphenyl)-1,3,5-tri(4-aminophenyl)benzene, 4,4',N"-tris[N,N',N"-triphenyl-N,N',N"-tris(3-methylphenyl] triphenylamine and the like. These materials may be used individually or in combinations of two or more.

When the hole transporting layer 2 is formed by vacuum deposition, the thickness of said layer is typically 30~100 nm, whereas when formed by an application method the thickness of said layer is typically 50~200 nm.

An organic luminescing layer 3 is formed on the aforesaid hole transporting layer 2. Well known organic luminescent materials may be used as the organic luminescing layer; examples of useful materials include tris(8-hydroxyquinoline)aluminum complex, 2,5-bis[5,7-di-t-pentyl-2-benzooxazolyl]thiophene, 2,2'-(1,4-phenylenedivinylene)bisbenzothiazole, 2,2'-(4,4'-biphenylene)bisbenzothiazole, 5-methyl-2-{2-[4-(5-methyl-2-benzooxazolyl)phenyl]vinyl}benzooxazole, 2,5-bis(5-methyl-2-benzooxazolyl)thiophene, anthracene, naphthalene, phenanthracene, pyrene, chrysene, perylene, perinone, 1,4-diphenylbutadiene, tetraphenylbutadiene, coumarin, acridene, stilbene, 2-(4-biphenyl)-6-phenylbenzooxazole, aluminum trisoxine, magnesium trisoxine, bis(benzo-8-quinolinol)zinc, bis(2-methyl-8-quinolinol)aluminumoxide, indium trisoxine, aluminumtris (5-methyloxine), lithiumoxide, gallium trisoxine, calciumbis(5-chlorooxine), polyzinc-bis(8-hydroxy-5-quinolinolyl)methane, zincbisoxine, 1,2-phthaloperinone, 1,2-naphthaloperinone and the like.

General fluorescent dyes such as, for example, fluorescent coumarin dye, fluorescent perylene dye, fluorescent pyran dye, fluorescent thiopyran dye, fluorescent, fluorescent, fluorescent imidazole dye and the like may be used. Among these materials, the most desirable are chelated oxynoid compounds.

The organic luminescing layer 3 may be constructed as a monolayer of luminescent material, or may be formed a multi-layer construction to adjust characteristics such as luminescent color, luminescent intensity and the like. The luminescing layer may be doped by mixing two or more luminescent materials.

The organic luminescing layer 3 may be formed by vacuum deposition of the aforesaid luminescent materials, or may be formed by dip coating or spin coating the aforesaid luminescent materials dissolved in a solvent or dissolved with a suitable resin.

When forming the layer by vacuum deposition, the thickness of the layer typically will be 1~500 nm, and desirably 1~200 nm, whereas when formed by an application method the thickness typically will be 5~1,000 nm, and preferably 5~500 nm.

The thicker the formed layer, the greater the voltage application required to achieve luminescence, thereby adversely affecting emission efficiency and causing rapid deterioration of the organic electroluminescent element. Although emission efficiency is excellent when the layer is thin, the service life of the organic electroluminescent element is shortened due to the rapid breakdown of the layer.

The electron injecting/transporting layer 6 formed on the organic luminescing layer 3 may be formed of well known electron injecting/transporting materials such as, for example, 2-(4-biphenylyl)-5-(4-tert-butylphenyl)-1,3,4-oxadiazole, 2-(1-naphthyl)-5-(4-tert-butylphenyl)-1,3,4-oxadiazole, 1,4-bis{2-[5-(4-tert-butylphenyl)-1,3,4-oxadiazolyl]}benzene, 1,3-bis{2-[5-(4-tert-butylphenyl)-1,3,4-oxadiazolyl]}benzene, 4,4'-bis{2-[5-(4-tert-butylphenyl)-1,3,4-oxadiazolyl]}biphenyl, 2-(4-biphenylyl)-5-(4-tert-butylphenyl)-1,3,4-thiodiazole, 2-(1-naphthyl)-5-(4-tert-butylphenyl)-1,3,4-thiodiazole, 1,4-bis{2-[5-(4-tert-butylphenyl)-1,3,4-thidiazole]}benzene, 1,3-bis{2-[5-(4-tert-butylphenyl)-1,3,4-thiodiazole]

}benzene, 4,4'-bis{2-[5-(4-tert-butylphenyl)-1,3,4-thiodiazole]}benzene, 3-(4-biphenylyl)-4-phenyl-5-(4-tert-butylphenyl)-1,2,4-triazole, 3-(1-naphthyl)-4-phenyl-5-(4-tert-butylphenyl)-1,2,4-triazole, 1,4-bis{3-[4-phenyl-5-(4-tert-butylphenyl)-1,2,4-triazolyl]}benzene, 1,3-bis{3-[4-phenyl-5-(4-tert-butylphenyl)-1,3,4-oxadiazolyl]}benzene, 4,4'-bis{2-[4-phenyl-5-(4-tert-butylphenyl)-1,3,4-oxadiazolyl]}biphenyl, 1,3,5-tris{2-[5-(4-tert-butylphenyl)-1,3,4-oxadiazolyl]}benzene and the like. These materials may be used individually or in combinations of two or more.

The electron injecting/transporting layer will have a thickness of 1~500 nm when formed by vacuum deposition, and a thickness of 5~1,000 nm when formed by an application method.

Then, the previously mentioned negative electrode is formed on the electron injecting/transporting layer 6. Metals used to form the negative electrode 4 will have a work function of less than 4 eV, e.g., magnesium, calcium, titanium, yttrium, gadolinium, ruthenium, manganese and alloys thereof.

The pair of positive and negative transparent electrodes are connected by lead wire 9 formed of suitable material such as nickel-chrome wire, gold wire, copper wire, platinum wire and the like, so as to induce luminescence of the organic luminescent device when a suitable voltage Vs is applied to both said electrodes.

In the organic electroluminescent element having the construction shown in FIG. 2, a sealing membrane 5 is formed on the negative electrode 4. The purpose of the sealing membrane 5 is to prevent oxidation and moisture-proof the negative electrode and organic layer; the sealing membrane 5 may be formed of SiO2, SiO, GeO, MgF2 and the like, and may be formed to a thickness of about 5~1,000 nm by vacuum deposition.

Manufacture of the organic electroluminescent element having the construction shown in FIG. 2 has been described above, but other configurations of the organic electroluminescent element are possible such as those constructions shown in FIGS. 1, 3, and 4.

When manufacturing the organic electroluminescent elements shown in FIGS. 1~4, it is desirable to use means to form the organic layer incorporating an organic luminescing layer, negative electrode, and preferably a sealing membrane in a constant vacuum without exposing the substrates to air after the electrodes substrates are dry washed. It is desirable, therefore, that a vacuum deposition or spattering method is used to form the hole injecting/transporting layer 2, organic luminescing layer 3, electron injecting/transporting layer 6, negative electrode 4, and sealing membrane 5 in a continuous vacuum.

After the dry washing process, the luminescing layer, negative electrode, and sealing membrane and the like are sequentially formed on the electrode substrate without exposure to air so as to prevent deterioration of the element due to exposure to moisture and oxygen in the atmosphere, thereby obtaining an organic electroluminescent element having a long service life and few non-luminescing areas.

The organic electroluminescent element of the present invention is applicable to various types of display devices.

The manufacturing apparatus and method for manufacturing the organic electroluminescent element of the resent invention is described hereinafter.

Figure 7:
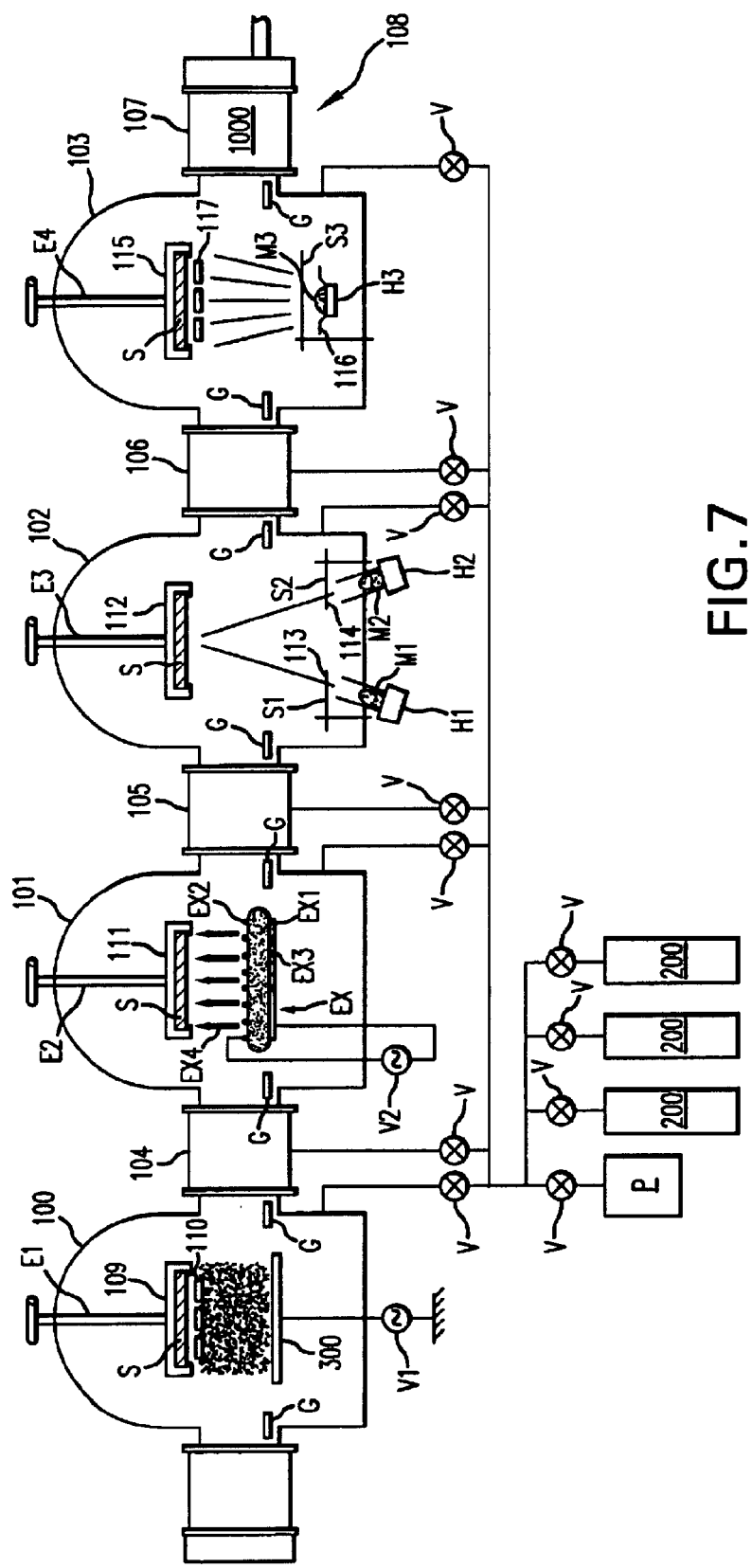
FIG. 7 is a brief section view of a manufacturing apparatus realizing the present invention.

FIG. 7 shows an example of a manufacturing apparatus usable to produce the present invention. The present invention is not limited to manufacture by this apparatus.

From the left side of the drawing are a chamber 100 for a dry etching process on a transparent electrode on substrate S in a vacuum, chamber 101 for a dry washing process on substrate S while under a continuous vacuum without exposure to air, chamber 102 for processing to form an organic layer incorporating an organic luminescing layer on substrate S, and chamber 103 for processing to form an electrode on said substrate S. The embodiment of the layout shown in the drawing provides that the aforesaid four chambers are connected by connecting chamber 104~106 which maintain the vacuum, and vacuum pump P connected to each said chamber and connecting chamber via valves V; connecting chamber 107 at the right edge of the drawing is provided with a transport mechanism 108 to transport substrate S inside each chamber. To realize the present invention, however, these four chambers need not necessarily be integratedly connected inasmuch as at least chambers 100 and 101 are integratedly constructed so as to carry out the dry etching process and dry washing process in a continuous vacuum without exposure to air. Each chamber is described below.

Chamber 100 carries out the dry etching process on the transparent electrode on the substrate S in a vacuum. Within chamber 100 a vacuum state is maintained by pump P via valve V. The dry etched substrate S is held in a conductive, grounded holder 109, which is linked to an elevator mechanism E1. Elevator mechanism E1 is constructed so as to be vertically movable in one direction and an opposite direction within the chamber. A metal mask 110 used for dry etching is positioned selectively inside or outside the vertical travel path of the elevator El. Plasma is generated for the dry etching; This plasma is generated by the action of an electric field of high energy produced when plasma gas is introduced within the chamber 100 within which a vacuum is maintained. The plasma gas is supplied from gas cylinder via valve V. The electric field is obtained by supplying a high frequency or low frequency voltage from power source V1 between holder 109 and a discharge electrode 300 disposed opposite at a predetermined spacing.

The substrate S held by holder 109 is provided with an electrode over its entire surface beforehand and is transported via a transport mechanism 108 described later, the unnecessary parts of said electrode are removed by dry etching via the action of the plasma acting through the metal mask 110 so as to form an electrode of a desired pattern.

Chamber 101 is for a dry washing process of substrate S under a continuous vacuum without exposure to air. The dry etched substrate S within chamber 100 is transported by a transport mechanism 108 through connecting chamber 104 into chamber 101, and an elevator E2 held in holder 111 is identical to that in chamber 100. Dry washing is accomplished using excimer light. Excimer light generator EX comprises a discharge tube EX1, opposing electrodes EX2 and EX3, and power source V2. Excimer gas is introduced into discharge tube EX1 at low pressure, and a voltage is supplied from power source V2 to between the opposing electrodes EX2 and EX3, and this voltage generates an electric field which indices plasma from the excimer gas, to excite the molecules to excimer state, and when the molecules in the excimer state return to their original energy level, excimer light EX4 is generated. Excimer light EX4 dry washes the entire surface of the substrate S.

Although the drawing shows washing by excimer light, the present invention is not limited to this mode, and therefore the interior of the chamber may be suitably modified.

For example, in the case of plasma washing, the metal mask 110 may be removable form the interior of the chamber 100. In the case of ultraviolet (UV)/ozone washing, the basic construction is identical to that of the excimer generator EX, but generation does not proceed to the excimer state due to the reduction of the voltage value supplied by the power source and the type of injected gas, and the various conditions of the excimer generator EX are set so as to generate ultraviolet rays. If oxygen is introduced into the chamber 100 from a gas pump 200 via valve V, the oxygen molecules are modified to ozone by the generated ultraviolet rays and used to carry out the UV/ozone wash.

Chamber 102 is used to perform the process of forming an organic layer incorporating an organic luminescing layer on the substrate S. Holder 112 and elevator mechanism E3 are common to chambers 100 and 101 and are therefore not described further.

In the drawing, chambers 113 and 114 are materials boxes to store raw materials M1 and M2 used to form the organic layer incorporating an organic luminescing layer, and are heated by heaters H1 and H2. Materials M1 and M2 are heated to a molten state under a low pressure state within chamber 102 achieved by pump P via valve V, and when shutters S1 and S2 are opened, these materials are vaporized and deposited on substrate S.

In the case of two materials boxes as shown in the drawing, the organic layer including an organic luminescing layer and other layers, typically a charge transporting layer, are formed by separate vacuum deposition of the material for the luminescing layer and the charge transporting layer. The present invention is not limited to this mode, however, insofar as when forming only a luminescing layer a single materials box is adequate, and a materials box may be added for layers having other functions, e.g., electron injecting layer or hole transporting layer.

Chamber 103 is used to carry out a process for forming an electrode on the substrate S which has passed through chambers 100 and 102. Holder 115 and elevator mechanism E4 are common to chamber 100 and are not further described.

In the drawing, reference number 116 refers to a boat accommodating raw material M3 used to form the electrode, and is heated by a heater H3. Material M3 is heated to a molten state under low pressure state within chamber 103 achieved by pump P via valve V, and when shutter S3 is opened, the material is vaporized and deposited on substrate S.

When patterning the electrode, a metal mask 117 is interposed between the holder 115 and boat 116. In this instance, the metal mask 117 is positioned selectively inside or outside the vertical movement path of the elevator mechanism E4 as previously described in chamber 100.

Figure 8:
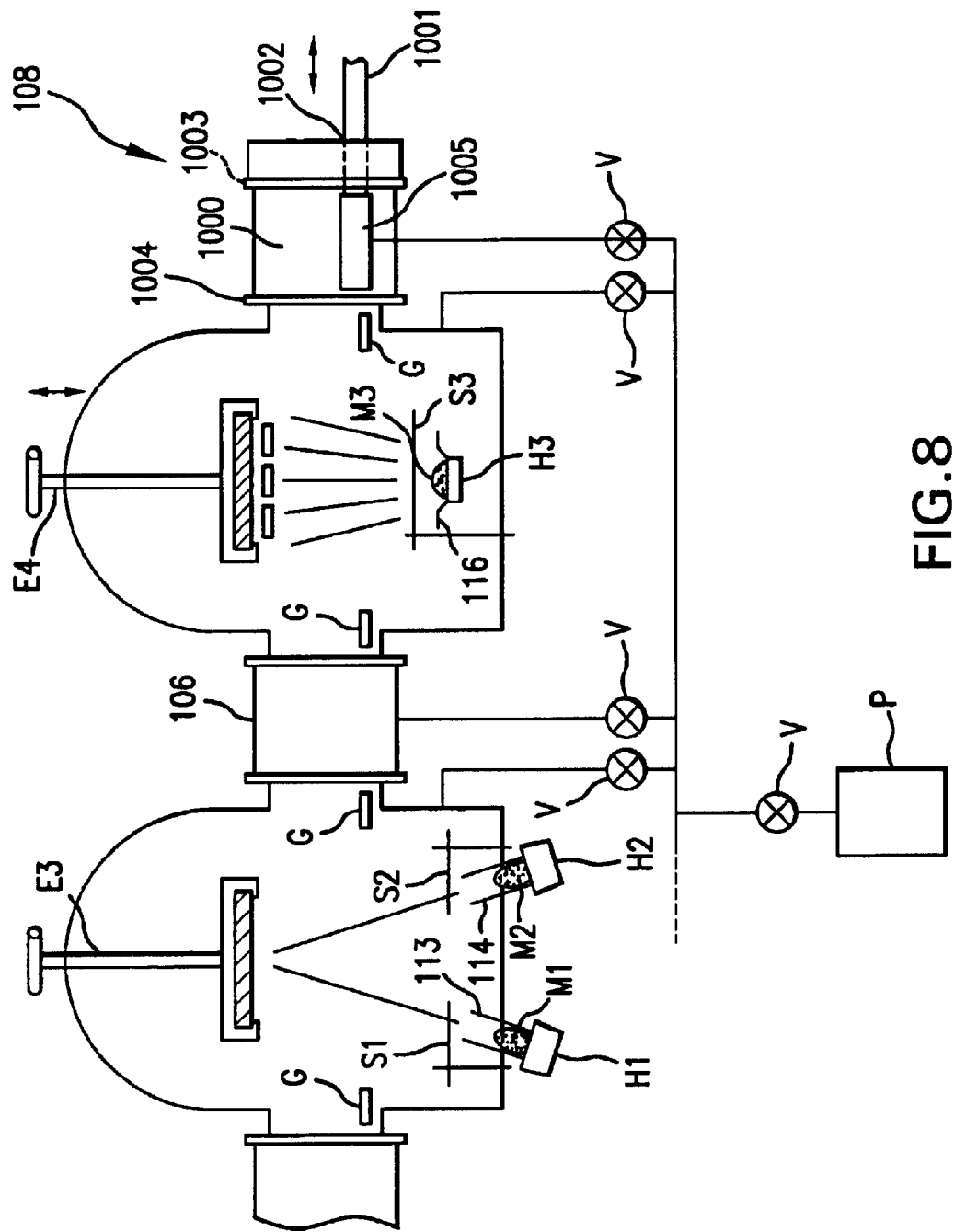
FIG. 8 is a brief section view showing details of part of the manufacturing apparatus shown in FIG. 8.

The relationship between the various chambers and the construction of the transport mechanism 108 is described hereinafter with reference to FIG. 8.

Substrate S is transported to the vacuum chambers of each process using a transport rod 1001 connected to holding room 1000 provided at the right side of the drawing. Transport rod 1001 is supported so as to be movable by seal member 1002 which maintains the vacuum. Exterior door 1003 and interior door 1004 are provided at the front and back of holding room 1000 so as to be capable of opening and closing; exterior door 1003 opens to load substrate S on material table 1005 provided at the tip of transport rod 1001. After substrate S is loaded, the exterior door 1003 is closed and pump P is started, and valve V is opened to evacuate the interior of holding room 1000. Then, the interior door 1004 of holding room 10000 is opened, and the front and back doors of each connecting chamber 104~106 are opened, and the material is transported into the interior of the respective vacuum chambers 100~103 using the transporting rod 1001. The construction and operation of the various doors are identical to that of exterior door 103 and interior door 1004 of holding room 1000.

The vacuum chambers into which the material has been introduced and the connecting chambers thereto are pressurized to a vacuum state beforehand. In this state, the transport rod 1001 is supported and guided by guide G provided in the chamber, so as to move the substrate S loaded on the material table 1005 into the desired vacuum chamber. In each vacuum chamber, the holder 109 and the like are brought near the material table 1005 using elevator mechanisms E1~E4, until the substrate S is supported in the holder. Then, the material table 1005 is returned to the holding room 1000 using the transporting rod 1001, and each of the doors is closed.

In each chamber, the holder is placed at a desired processing position using the elevator mechanism, and substrate S is subjected to various processes.

Figure 9:
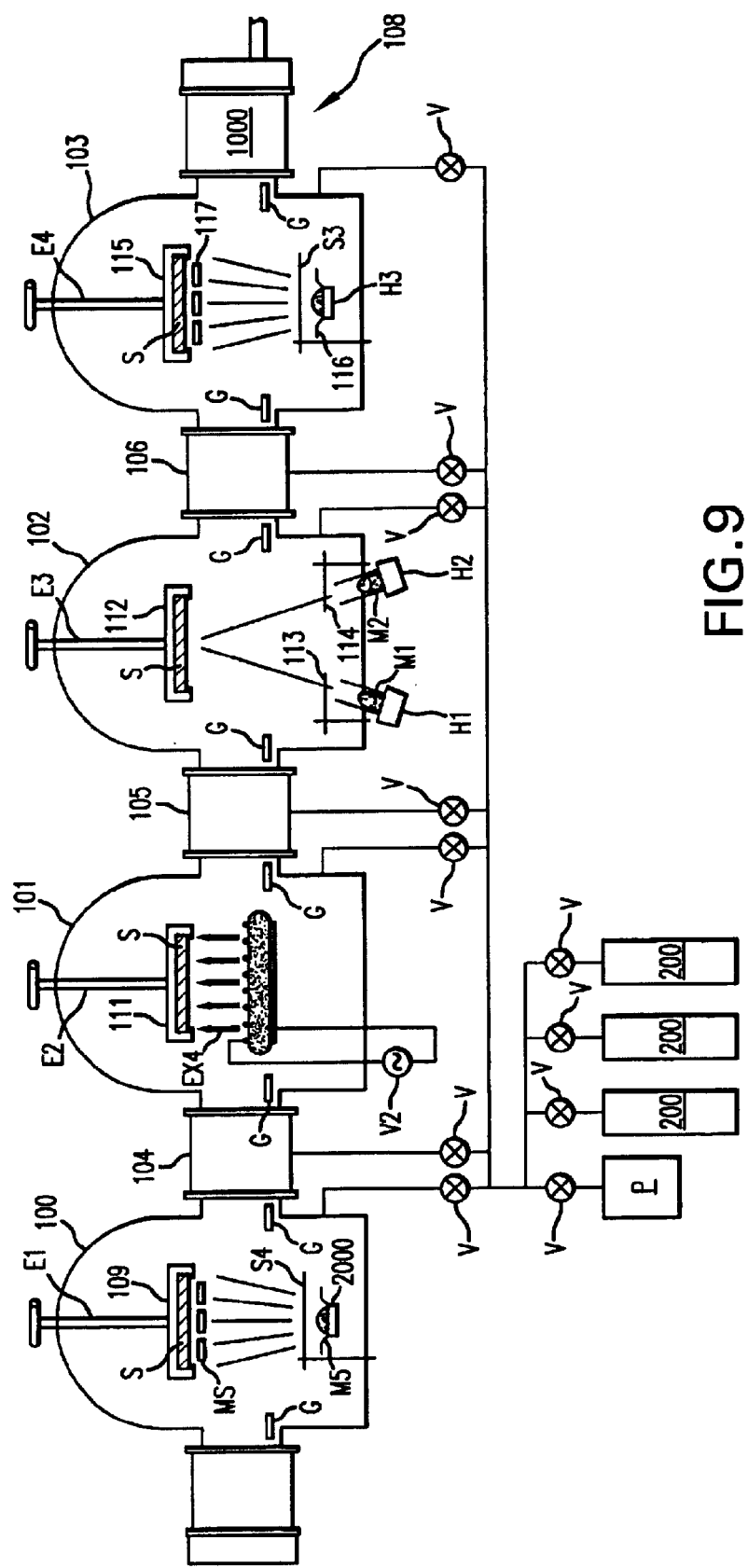
FIG. 9 is a brief section view showing details of part of another manufacturing apparatus realizing the present invention.

FIG. 9 shows a modification of the manufacturing apparatus of FIG. 7. In the apparatus of FIG. 7 the entire surface of substrate S is provided with an electrode beforehand, and subjected to dry etching within chamber 100 to remove part of the electrode to produce a patterned electrode. In the modification of FIG. 9, the electrode is not formed by dry etching, but rather formed by patterning an electrode on the substrate S which is not provided with an electrode on its entire surface beforehand. Specifically, after a metal mask MS and transparent glass substrate S are placed in holder 109 within the evacuated vacuum chamber 100, a material boat 2000 accommodating a metal M5 comprising a material to form a desired electrode is heated, and shutter S4 is opened so as to form a pattern of metal M5 on the glass substrate S to form the electrode. Electrode formation need not be accomplished by vacuum deposition, and may alternatively be accomplished by spattering method.

Specific examples of the present invention are described in detail hereinafter.

EXAMPLE 1

In this example, a manufacturing apparatus is used having chambers 100 and 101 of integrated construction, and chambers 102 and 103 uniformly constructed. A plasma washing mechanism is provided within the dry washing chamber 101.

The ITO membrane of a commercial glass substrate S provided with an ITO membrane (Geomatechn Co. Ltd.) was thoroughly cleaned with distilled water and acetone in ultrasound cleaning processes lasting 20 min, respectively, then the substrate S was placed in holder 109, and the interior of chamber 100 was evacuated to a vacuum of less than $1.0 \times 10-5$ Torr via pump P.

Then, $C_2H_5I$/Ar gas mixture was introduced via gas cyclinder 200 and valve V to attain a vacuum of $5.0 \times 10-2$ Torr within chamber 100, and dry etching was performed for 15 min on substrate S via metal mask 110 at a voltage of 1 W/cm2 via power source V1. Next, etching was repeated at 20% of the previous output at a pressure of 0.1 Torr. The gas flow rate was 400 sccm.

There was no continuity of the etched part of the obtained ITO layer and the edges were cleanly tapered.

The obtained ITO substrate S was directly transported to chamber 101 via transporting mechanism 108 without exposure to air. After the interior of chamber 101 was evacuated to a pressure of less than 1.0×10–5 Torr, O2 gas was introduced into the chamber to attain a vacuum pressure of 0.2 Torr, and a high frequency voltage of 0.2 W/cm2 was applied for 30 min to plasma wash the ITO substrate S.

The vacuum in chamber 101 was broken, and the ITO substrate S was removed. The substrate S was then reset in holder 112 of chamber 102 in the manufacturing apparatus having an integratedly constructed chambers 102 and 103. Then, the interior of chamber 102 was evacuated to a vacuum pressure of less than 1.0×10–5 Torr by pump P, and a triphenylamine dielectric (N,N'-diphenyl-N,N'-bis(3-methylphenyl)-1,1'-biphenyl-4,4'-diamine) represented by chemical structural formula A below previously stored in material box 113 was vacuum deposited to a layer thickness of 65 nm at a vacuum deposition speed of 5 A/sec to produce a hole injecting/transporting layer.

Then, while maintaining the vacuum state within the chamber, tris(8-hydroxyquinoline) aluminum complex accommodated in material box 114 was vacuum deposited to a layer thickness of 65 nm at a rate of 6 A/sec to form a luminescing layer on substrate S.

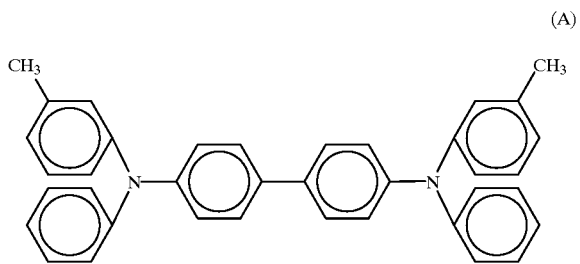

(A)

The substrate S was then transported from chamber 102 to chamber 103 via transport mechanism 108 without breaking the vacuum state. Then, A mixture of Mg and Ag accommodated in boat 116 was heated by heater H3 and vacuum deposited together at a ratio of 10:1 to form an electrode about 200 nm in thickness.

The organic electroluminescent element was manufactured via the aforesaid processes.

EXAMPLE 2

In this example, a manufacturing apparatus is used having chambers 100 and 101 of integrated construction, and chambers 102 and 103 uniformly constructed, said apparatus being identical to that used in example 1. A plasma washing mechanism is provided within the dry washing chamber 101.

The ITO membrane of a commercial glass substrate S provided with an ITO membrane (Geomatechn Co. Ltd.) was thoroughly cleaned with distilled water and acetone in ultrasound cleaning processes lasting 20 min, respectively, and the interior of chamber 100 was evacuated to a vacuum of less than 1.0×10–5 Torr via pump P.

Then, while maintaining the vacuum state, HI/Ar gas mixture was introduced to attain a vacuum of 2.0×10–2 Torr within chamber 100, and dry etching was performed for 3 min on substrate S via metal mask 110 at a voltage of 1 W/cm2. Next, etching was repeated at 20% of the previous output at a pressure of 0.1 Torr. The gas flow rate was 300 sccm.

There was no continuity of the etched part of the obtained ITO layer and the edges were cleanly tapered.

After the interior of chamber 101 was evacuated to a pressure of less than 1.0×10–5 Torr without exposure to air, O2 gas was introduced into the chamber to attain a vacuum pressure of 0.2 Torr, and a high frequency voltage of 0.2 W/cm2 was applied for 30 min to plasma wash the ITO substrate S.

The vacuum in chamber 101 was broken, and the ITO substrate S was removed, and placed in holder 112 of another apparatus having an integratedly constructed chambers 102 and 103. Then, the interior of chamber 102 was evacuated to a vacuum pressure of less than 1.0×10–5 Torr by pump P, and a triphenylamine dielectric represented by chemical structural formula A was vacuum deposited to a layer thickness of 65 nm at a vacuum deposition speed of 5 A/sec to produce a hole injecting/transporting layer via the same method as in example 1.

Then, while maintaining the vacuum state within the chamber, tris(8-hydroxyquinoline) aluminum complex was vacuum deposited to a layer thickness of 65 nm at a rate of 6 A/sec to form a luminescing layer on substrate S.

The substrate S was then transported from chamber 102 to chamber 103 via transport mechanism 108. Then, A mixture of Mg and Ag vacuum deposited together at a ratio of 10:1 to form a negative electrode about 200 nm in thickness on the luminescing layer.

The organic electroluminescent element was manufactured via the aforesaid processes.

EXAMPLE 3

Example 3 uses the manufacturing apparatus with chambers 100~103 of integrated construction, as shown in FIG. 7.

Just as in example 2, patterning and plasma washing of ITO substrate S was performed n chambers 100 and 101, and after dry washing via plasma process, the substrate S was moved into chamber 102 without exposure to air. Then, a triphenylamine dielectric represented by chemical structural formula A was vacuum deposited in a vacuum of 1.0×10–5 Torr to a layer thickness of 65 nm at a vacuum deposition speed of 5 A/sec to produce a hole injecting/transporting layer.

Then, while similarly maintaining the vacuum state within the chamber, tris(8-hydroxyquinoline) aluminum complex was vacuum deposited to a layer thickness of 65 nm at a rate of 6 A/sec to form a luminescing layer on substrate S.

The substrate S was then transported into chamber 103 without breaking the vacuum state, and a mixture of Mg and Ag was vacuum deposited together at a ratio of 10:1 to form an electrode about 200 nm in thickness.

The organic electroluminescent element was manufactured via the aforesaid processes.

EXAMPLE 4

Example 4 uses a modification of the manufacturing apparatus shown in FIG. 9.

After glass substrate S was washed by ultrasonic cleaning using distilled water and acetone for 20 min, respectively, the pressure in the chamber was reduced to a vacuum of less than 1.0×10–5 Torr.

ITO alloy was deposited by spattering method at a deposition rate of 5 A/sec to form a layer 200 nm in thickness as a positive electrode. Then, plasma washing, organic compound layer, and negative electrode were performed in the same manner as described in example 3.

The organic electroluminescent element was manufactured via the aforesaid processes.

EXAMPLE 5

Example 5 uses a manufacturing apparatus having chambers 100 and 101 of integrated construction, and chambers 102 and 103 uniformly constructed, said apparatus being identical to that used in example 3. An excimer light washing device shown in FIG. 7 was used.

The ITO membrane of a commercial glass substrate S provided with an ITO membrane (Geomatechn Co. Ltd.) was thoroughly cleaned with distilled water and acetone in ultrasound cleaning processes lasting 20 min, respectively, and substrate S was placed in holder 109 of chamber 100 which was then evacuated to a vacuum of less than $1.0\times10-5$ Torr.

Then, while maintaining the vacuum state, Br/Ar gas mixture was introduced to attain a vacuum of $2.0\times10-2$ Torr within chamber 100, and dry etching was performed for 3 min on substrate S at a voltage of 1 W/cm2. Next, etching was repeated at 20% of the previous output at a pressure of 0.1 Torr.

There was no continuity of the etched part of the obtained ITO layer and the edges were cleanly tapered.

The obtained ITO substrate S was transported by transporting mechanism 108 into chamber 101 provided with an excimer irradiation device EX without exposure to air. After the interior of chamber 101 was evacuated to a pressure of less than $1.0\times10-5$ Torr, pure air was introduced into the chamber to attain a vacuum pressure of 0.2 Torr in chamber 101, and substrate S was irradiated for 3 min by excimer light at the 172 nm wavelength.

The vacuum in chamber 101 was broken, and the ITO substrate S was removed. Substrate S was placed in holder 112 of chamber 102, then the interior of chamber 102 was evacuated to a vacuum pressure of less than $1.0\times10-5$ Torr, and a triphenylamine dielectric represented by chemical structural formula A was deposited using resistance heating method to a layer thickness of 65 nm at a vacuum deposition speed of 5 A/sec to produce a hole injecting/transporting layer. Then, while maintaining the vacuum state within the chamber, tris(8-hydroxyquinoline) aluminum complex was vacuum deposited to a layer thickness of 65 nm at a rate of 6 A/sec to form a luminescing layer on substrate S.

Finally, the substrate S was then transported to chamber 103 without breaking the vacuum, and a mixture of Mg and Ag vacuum deposited together at a ratio of 10:1 via resistance heating method to form a negative electrode about 200 nm in thickness on the luminescing layer.

The organic electroluminescent element was manufactured via the aforesaid processes.

EXAMPLE 6

Example 6 basically was conducted in the same manner as example 5. Chamber 100 was provided with a device to form an electrode by vacuum deposition as shown in FIG. 9, and was not provided with a dry etching device.

Glass substrate S was subjected to ultrasonic cleaning by distilled water and acetone for 20 min, respectively, then substrate S was placed in holder 109 of chamber 100 together with patterning mask 110, and chamber 100 was evacuated to a vacuum pressure of less than $1.0\times10-5$ Torr.

An ITO alloy accommodated in boat 2000 was deposited by sputtering method at a vacuum deposition rate of 5 A/sec to form a positive electrode having a thickness of 200 nm on substrate S. Then, the obtained ITO substrate S was transported to chamber 101 provided with an excimer irradiation device EX without exposure to air, and placed in holder 111. After the pressure in chamber 101 was reduced to less than $1.0\times10-5$ Torr, pure air was introduced into the chamber to attain a vacuum pressure of 0.2 Torr, and the substrate S was irradiated for 3 min by excimer light of the 172 nm wavelength via excimer irradiation device EX.

The vacuum of chamber 101 was broken and the ITO substrate S was removed.

Substrate S was then reset in holder 112 of chamber 102, then the interior of chamber 102 was evacuated to a vacuum pressure of less than $1.0\times10-5$ Torr, and a triphenylamine dielectric represented by chemical structural formula A was vacuum deposited to a layer thickness of 65 nm at a vacuum deposition speed of 5 A/sec to produce a hole injecting/transporting layer. Then, while maintaining the vacuum state within the chamber, tris(8-hydroxyquinoline) aluminum complex was vacuum deposited to a layer thickness of 65 nm at a rate of 6 A/sec to form a luminescing layer on substrate S.

Substrate S was then transported from chamber 102 to chamber 103 via transport mechanism 108 while maintaining the vacuum, and a mixture of Mg and Ag was vacuum deposited together at a ratio of 10:1 to form a negative electrode about 200 nm in thickness on the luminescing layer.

Next, while maintaining the vacuum, magnesium fluoride was deposited via a resistance heating method to form a sealing membrane 300 nm in thickness.

The organic electroluminescent element was manufactured via the aforesaid processes.

EXAMPLE 7

Example 7 was performed n the same manner as example 6 with the exception that a UV/ozone washing device was used in place of the excimer irradiation device for the dry washing process.

Glass substrate S was subjected to ultrasonic cleaning by distilled water and acetone for 20 min, respectively, then substrate S was placed in holder 109 of chamber 100 together with patterning mask 110, and chamber 100 was evacuated to a vacuum pressure of less than $1.0\times10-5$ Torr.

An ITO alloy was deposited by sputtering method at a vacuum deposition rate of 5 A/sec to form a positive electrode having a thickness of 200 nm on substrate S. Then, the obtained ITO substrate S was transported into the chamber provided with a UV/ozone washing device without exposure to air, and after the pressure in the chamber was reduced to less than $1.0\times10-5$ Torr, oxygen gas was introduced into the chamber to attain a vacuum pressure of 0.2 Torr, and the substrate S was irradiated for 30 min.

The vacuum in the chamber was broken and the ITO substrate S was removed. Substrate S was then reset in holder 112 of chamber 102, then the interior of chamber 102 was evacuated to a vacuum pressure of less than $1.0\times10-5$ Torr, and a triphenylamine dielectric represented by chemical structural formula A was vacuum deposited by resistance heating method to a layer thickness of 65 nm at a vacuum deposition speed of 5 A/sec to produce a hole injecting/transporting layer. Then, while maintaining the vacuum state within the chamber, tris(8-hydroxyquinoline) aluminum complex was vacuum deposited to a layer thickness of 65 nm at a rate of 6 A/sec to form a luminescing layer on substrate S.

Substrate S was then transported from chamber 102 to chamber 103 via transport mechanism 108 while maintaining the vacuum, and a mixture of Mg and Ag was deposited together by resistance heating method at a ratio of 10:1 to form a negative electrode about 200 nm in thickness on the luminescing layer.

Next, while maintaining the vacuum, magnesium fluoride was deposited via a resistance heating method to form a sealing membrane 300 nm in thickness.

The organic electroluminescent element was manufactured via the aforesaid processes.

EXAMPLE 8

Example 8 used the apparatus shown in FIG. 9.

Glass substrate S was subjected to ultrasonic cleaning by distilled water and acetone for 20 min, respectively, then substrate S was placed in holder 109 together with patterning mask 110, and chamber 100 was evacuated to a vacuum pressure of less than $1.0 \times 10-5$ Torr.

An ITO alloy accommodated in boat 2000 was deposited by spattering method at a vacuum deposition rate of 5 A/sec to form a positive electrode having a thickness of 200 nm on substrate S. Then, the obtained ITO substrate S was transported to chamber 101 provided with an excimer irradiation device EX without exposure to air. After the pressure in chamber 101 was reduced to less than $1.0 \times 10-5$ Torr, pure air was introduced into the chamber to attain a vacuum pressure of 0.2 Torr, and the substrate S was irradiated for 3 min by excimer light of the 172 nm wavelength via excimer irradiation device EX.

Substrate S was then reset in holder 112 of chamber 102, then the interior of chamber 102 was evacuated to a vacuum pressure of less than $1.0 \times 10-5$ Torr, and a triphenylamine dielectric represented by chemical structural formula A was vacuum deposited by resistance heating method to a layer thickness of 65 nm at a vacuum deposition speed of 5 A/sec to produce a hole injecting/transporting layer. Then, while maintaining the vacuum state within the chamber, tris(8-hydroxyquinoline) aluminum complex was vacuum deposited to a layer thickness of 65 nm at a rate of 6 A/sec to form a luminescing layer on substrate S.

Substrate S was then transported to chamber 102 via transport mechanism 108 while maintaining the vacuum, and a mixture of Mg and Ag was vacuum deposited together via resistance heating method at a ratio of 10:1 to form a negative electrode about 200 nm in thickness on the luminescing layer.

Next, while maintaining the vacuum, silicon oxide was deposited via a low resistance heating method to form a sealing membrane 300 nm in thickness.

The organic electroluminescent element was manufactured via the aforesaid processes.

COMPARATIVE EXAMPLE 1

A commercial glass substrate provided with an ITO membrane (Geomatechn Co. Ltd.) was thoroughly washed with distilled water and acetone via ultrasonic cleaning for 20 min, respectively, then a registration pattern was applied via screen printing, and dried for 15 min at 80° C., then etched with hydrochloric acid as an etching fluid.

After confirming non-continuity, the substrate was immersed in 2% sodium hydroxide solvent to dissolve the registration.

The substrate was sequentially subjected to ultrasound washing using surface active agent, water, isopropanol, and methanol. The substrate was then acid washed with dilute sulfuric acid, subjected to ultrasonic washing with distilled water, and dried.

The etched part of the ITO layer had no continuity, and the pattern had clean edges.

The obtained ITO substrate was set in a chamber provided with a UV/ozone washing device, and the chamber was evacuated to a vacuum pressure of less than $1.0 \times 10-5$ Torr, then oxygen gas was introduced to attain a pressure of 0.2 Torr, and the substrate S was irradiated for 30 min.

The ITO substrate was removed and placed in a holder in another chamber, which was then to a vacuum pressure of less than $1.0 \times 10-5$ Torr, and a triphenylamine dielectric represented by chemical structural formula A was deposited by resistance heating method to a layer thickness of 65 nm at a vacuum deposition speed of 5 A/sec to produce a hole injecting/transporting layer. Then, while maintaining the vacuum state within the chamber, tris(8-hydroxyquinoline) aluminum complex was deposited to a layer thickness of 65 nm at a rate of 6 A/sec to form a luminescing layer on substrate S.

Next, while maintaining the vacuum, Mg and Ag were deposited via a low resistance heating method to form a negative electrode 200 nm in thickness.

The organic electroluminescent element was manufactured via the aforesaid processes.

COMPARATIVE EXAMPLE 2

A commercial glass substrate provided with an ITO membrane (Geomatechn Co. Ltd.) was thoroughly washed with distilled water and acetone via ultrasonic cleaning for 20 min, respectively, then a registration pattern was applied via screen printing, and dried for 15 min at 80° C., then etched with hydrochloric acid as an etching fluid.

After confirming non-continuity, the substrate was immersed in 2% sodium hydroxide solvent to dissolve the registration.

The substrate was sequentially subjected to ultrasound washing using surface active agent, water, isopropanol, and methanol. The substrate was then acid washed with dilute sulfuric acid, subjected to ultrasonic washing with distilled water, and dried.

The etched part of the ITO layer had no continuity, and the pattern had clean edges.

The obtained ITO substrate was set in a chamber, and the chamber was evacuated to a vacuum pressure of less than $1.0 \times 10-5$ Torr, then oxygen gas was introduced to attain a pressure of 0.2 Torr, and a high frequency voltage of 0.2 W/cm2 was applied to plasma wash the substrate for 30 min.

The ITO substrate was placed in a holder in a layer forming apparatus while maintaining the vacuum of less than $1.0 \times 10-5$ Torr, and a triphenylamine dielectric represented by chemical structural formula A was deposited by resistance heating method to a layer thickness of 65 nm at a vacuum deposition speed of 5 A/sec to produce a hole injecting/transporting layer. Then, tris(8-hydroxyquinoline) aluminum complex was deposited to a layer thickness of 65 nm at a rate of 6 A/sec to form a luminescing layer on substrate S.

Next, while maintaining the vacuum, Mg and Ag were deposited via a low resistance heating method to form a negative electrode 200 nm in thickness.

The organic electroluminescent element was manufactured via the aforesaid processes.

COMPARATIVE EXAMPLE 3

A commercial glass substrate provided with an ITO membrane (Geomatechn Co. Ltd.) was thoroughly washed with distilled water and acetone via ultrasonic cleaning for 20 min, respectively, then a registration pattern was applied via screen printing, and dried for 15 min at 80° C., then etched with hydrochloric acid as an etching fluid.

After confirming non-continuity, the substrate was immersed in 2% sodium hydroxide solvent to dissolve the registration.

The substrate was sequentially subjected to ultrasound washing using surface active agent, water, isopropanol, and methanol. The substrate was then acid washed with dilute sulfuric acid, subjected to ultrasonic washing with distilled water, and dried.

The etched part of the ITO layer had no continuity, and the pattern had clean edges.

The obtained ITO substrate was set in a an excimer irradiation device, and the chamber was evacuated to a vacuum pressure of less than $1.0 \times 10^{-5}$ Torr, then pure air was introduced to attain a pressure of 0.2 Torr, and the substrate was irradiated by excimer light of the 172 nm wavelength for 3 min.

The ITO substrate was removed, and placed in a holder in another layer forming apparatus, and a vacuum of less than $1.0 \times 10^{-5}$ Torr was attained, and a triphenylamine dielectric represented by chemical structural formula A was deposited by resistance heating method to a layer thickness of 65 nm at a vacuum deposition speed of 5 Å/sec to produce a hole injecting/transporting layer. Then, tris(8-hydroxyquinoline) aluminum complex was deposited to a layer thickness of 65 nm at a rate of 6 Å/sec to form a luminescing layer on substrate S.

Next, while maintaining the vacuum, Mg and Ag were deposited via a low resistance heating method to form a negative electrode 200 nm in thickness.

The organic electroluminescent element was manufactured via the aforesaid processes.

Evaluation

The organic electroluminescent elements of examples 1~6 and comparative examples 1~2 were subjected to measurement of luminescence (luminescence irregularity, dark spots and the like) of luminescence brightness (cd/m2) when a DC starting voltage V and 10 V DC voltage were applied continuously to a glass electrode used as a positive electrode. Each element was manufactured four times to measure reproducibility of the element performance.

Each element was luminesced continuously at a starting luminance of 100 cd/m2 at room temperature and in an atmosphere of inert nitrogen gas to measure the half-life decay of luminance brightness (i.e., until brightness reached 50 cd/m2).

Evaluation

The organic electroluminescent elements of examples 1~8 and comparative examples 1~3 were subjected to measurement of luminescence (luminescence irregularity, dark spots and the like) of luminescence brightness (cd/m2) when a DC starting voltage V and 10 V DC voltage were applied continuously to a glass electrode used as a positive electrode. Each element was manufactured four times to measure reproducibility of the element performance.

Each element was luminesced continuously at a starting luminance of 100 cd/m2 at room temperature and in an atmosphere of inert nitrogen gas to measure the half-life decay of luminance brightness (i.e., until brightness reached 50 cd/m2).

Measurement results are shown in Table 1 In the table, reference symbol A represents excellent, B represents good, C represents fair, D represents poor.

TABLE 1

|  | Irregular luminescence | Dark spots | Element performance reproducibility | luminescence starting voltage (V) | Brightness (cd/m2) | Luminescence decay |
|---|---|---|---|---|---|---|
| Ex 1 | B | A | B | 5.0 | 7800 | 347 hr |
| Ex 2 | B | A | B | 5.0 | 8500 | 382 hr |
| Ex 3 | A | A | A | 4.5 | 10100 | 451 hr |
| Ex 4 | A | A | A | 4.5 | 10600 | 486 hr |
| Ex 5 | B | A | B | 4.5 | 9300 | 409 hr |
| Ex 6 | B | A | B | 5.0 | 8700 | 395 hr |
| Ex 7 | B | A | B | 4.5 | 9500 | 417 hr |
| Ex 8 | B | A | B | 5.0 | 9200 | 403 hr |
| CE 1 | C | D | D | 6.0 | 1400 | 184 hr |
| CE 2 | B | B | C | 5.5 | 4500 | 276 hr |
| CE 3 | B | B | D | 5.5 | 3100 | 231 hr |

As can be understood from Table 1, the organic electroluminescent element of the present invention exhibits excellent luminescence brightness at low voltage, and low luminescence starting voltage with a uniform luminescence from the element surface.

The organic electroluminescent element of the present invention provides long service life and improved luminescence brightness, and is not limited in the luminescent materials, luminescence enhancing materials, charge transporting materials, sensitizers, resins, electrode materials or element manufacturing methods used.

The organic electroluminescent element of the present invention provides uniform luminescence without non-luminescing spots, and provides excellent durability. The present invention further provides a high degree of luminescence brightness and low luminescence starting voltage.

Although the present invention has been fully described by way of examples with reference to the accompanying drawings, it is to be noted that various changes and modification will be apparent to those skilled in the art. Therefore, unless otherwise such changes and modifications depart from the scope of the present invention, they should be construed as being included therein.

What is claimed is:

1. A process for preparing an organic electroluminescent element consisting essentially of:

forming a positive electrode substrate by dry etching a transparent electrode in a vacuum;

dry washing said formed positive electrode substrate, the vacuum being unbroken from the positive electrode substrate forming through the dry washing, said dry washing being selected from the group consisting of a plasma process using oxygen, an UV/ozone process and an excimer irradiation process;

forming an organic layer incorporating an organic luminescing layer on said dry washed positive electrode substrate; and forming a negative electrode on said formed organic layer.

2. The process claimed in claim 1, wherein the dry etching is a plasma etching.

3. The process claimed in claim 2, wherein the plasma etching uses an etching gas selected from the group consisting of $GH_4$, HCl, HBr, HI and $C_2H_5I$.

4. The process claimed in claim 1, wherein the organic layer forming comprises forming a hole injecting/ transporting layer on said dry washed positive electrode substrate and forming the organic luminescing layer on the hole injecting/transporting layer.

5. The process claimed in claim 1, wherein the organic layer forming comprises forming a hole injecting/transporting layer on said dry washed positive electrode substrate, forming the organic luminescing layer on the hole injecting/transporting layer and forming an electron injecting/transporting layer on the organic luminescing layer.

6. The process claimed in claim 1, wherein the organic layer forming comprises forming the organic luminescing layer on said dry washed positive electrode substrate and forming an electron injecting/transporting layer on the organic luminescing layer.

7. The process claimed in claim 1, wherein the organic luminescing layer includes an organic luminescing material and a charge transporting material.

8. The process claimed in claim 1, further comprising forming a sealing membrane on said negative electrode.

9. The process claimed in claim 8, wherein the sealing membrane comprises $SiO_2$, SiO, GeO or $MgF_2$.

10. The process claimed in claim 1, wherein the resulting electroluminescent element has a brightness in a range of 7,800 to 10,600 cd/m$^2$.

11. A process for preparing an organic electroluminescent element consisting essentially of:
    forming a positive electrode substrate by dry etching a transparent electrode;
    dry washing said formed positive electrode substrate, said dry washing being selected from the group consisting of a plasma process using oxygen, an UV/ozone process and an excimer irradiation process;
    forming an organic layer incorporating an organic luminescing layer on said dry washed positive electrode substrate; and
    forming a negative electrode on said formed organic layer,
wherein the process is carried out under a vacuum continuously from said positive electrode substrate forming to said negative electrode forming.

12. The process claimed in claim 11, wherein the dry etching is a plasma etching.

13. The process claimed in claim 12, wherein the plasma etching uses an etching gas selected from the group consisting of $CH_4$, HCl, HBr, HI and $C_2H_5I$.

14. The process claimed in claim 11, wherein the organic layer forming comprises forming a hole injecting/transporting layer on said dry washed positive electrode substrate and forming the organic luminescing layer on the hole injecting/transporting layer.

15. The process claimed in claim 11, wherein the organic layer forming comprises forming a hole injecting/transporting layer on said dry washed positive electrode substrate, forming the organic luminescing layer on the hole injecting/transporting layer and forming an electron injecting/transporting layer on the organic luminescing layer.

16. The process claimed in claim 11, wherein the organic layer forming comprises forming the organic luminescing layer on said dry washed positive electrode substrate and forming an electron injecting/transporting layer on the organic luminescing layer.

17. The process claimed in claim 11, wherein the organic luminescing layer includes an organic luminescing material and a charge transporting material.

18. The process claimed in claim 11, further comprising forming a sealing membrane on said negative electrode.

19. The process claimed in claim 18, wherein the sealing membrane comprises $SiO_2$, SiO, GeO or $MgF_2$.

20. The process claimed in claim 11, wherein the resulting electroluminescent element has a brightness in a range of 7,800 to 10,600 cd/m$^2$.

* * * * *